US 8,059,921 B2

(12) United States Patent
Frohlich et al.

(10) Patent No.: US 8,059,921 B2
(45) Date of Patent: Nov. 15, 2011

(54) ASSOCIATING AUDIO AND IMAGE DATA

(75) Inventors: David Mark Frohlich, Bristol (GB);
Guy de Warrenne Bruce Adams,
Stroud (GB)

(73) Assignee: Hewlett-Packard Development Company, L.P., Houston, TX (US)

( * ) Notice: Subject to any disclaimer, the term of this patent is extended or adjusted under 35 U.S.C. 154(b) by 2089 days.

(21) Appl. No.: 10/426,039

(22) Filed: Apr. 30, 2003

(65) Prior Publication Data
US 2004/0037540 A1 Feb. 26, 2004

(30) Foreign Application Priority Data

Apr. 30, 2002 (GB) .................................. 0209939.8

(51) Int. Cl.
G06K 7/10 (2006.01)
G06F 17/00 (2006.01)
(52) U.S. Cl. ........................................ 382/321; 715/202
(58) Field of Classification Search .................. 382/321; 715/202
See application file for complete search history.

(56) References Cited

U.S. PATENT DOCUMENTS

| | | | |
|---|---|---|---|
| 3,439,598 A | 4/1969 | Weitzner et al. | |
| 4,270,853 A | 6/1981 | Hatada et al. | |
| 4,270,854 A | 6/1981 | Stemme et al. | |
| 4,816,928 A | 3/1989 | Sasaki et al. | |
| 4,905,029 A | 2/1990 | Kelley | |
| 5,276,472 A | 1/1994 | Bell et al. | |
| 6,128,037 A * | 10/2000 | Anderson | 348/231.4 |
| 6,167,233 A | 12/2000 | Gresser, Jr. et al. | |
| 6,204,840 B1 * | 3/2001 | Petelycky et al. | 715/500.1 |
| 6,249,644 B1 * | 6/2001 | Inoue et al. | 386/130 |
| 6,334,025 B1 | 12/2001 | Yamagami | |
| 6,421,470 B1 * | 7/2002 | Nozaki et al. | 382/321 |
| 6,431,448 B1 * | 8/2002 | Nelson et al. | 235/462.13 |
| 7,062,576 B2 * | 6/2006 | Ohmura et al. | 710/35 |

FOREIGN PATENT DOCUMENTS

| | | |
|---|---|---|
| EP | 0 618 526 A2 | 3/1994 |
| EP | 1283523 | 12/1999 |
| EP | 1 151 600 B1 | 1/2000 |
| EP | 1 056 094 A1 | 5/2000 |
| GB | 2 368 685 A | 5/2001 |
| WO | 00/03299 | 1/2000 |
| WO | 00/13159 | 3/2000 |
| WO | 00/48388 | 8/2000 |
| WO | WO 0048388 A1 * | 8/2000 |

* cited by examiner

Primary Examiner — Wenpeng Chen

(57) ABSTRACT

An audio photograph data storage system stores a printed image and a plurality of audio segments associated with the printed image. The audio segments are arranged in a plurality of audio layers.

27 Claims, 14 Drawing Sheets

ASSOCIATING AUDIO AND IMAGE DATA

FIELD OF THE INVENTION

The present invention relates to audio photography.

BACKGROUND

Prior art systems for recording sound clips associated with a photographic image are known from several sources. Earlier systems often relied on a magnetic recording medium attached to a film sheet.

U.S. Pat. No. 3,439,598 discloses a still image camera having a sound recording device recording a message to a rotating sound recording medium on a film layer, and dates back to 1966. U.S. Pat. No. 4,270,853 discloses an instant camera which has a sweeping magnetic recording head which records sound on a magnetic band of a film. That system enables recording of sound both before and after capture of a photograph image, and has multiple magnetic sound recording tracks on an instant film photograph.

In U.S. Pat. No. 4,905,029 there is disclosed an audio still camera system which captures image and sound, which allows a user to play back a sound associated with a photograph after the photograph has been inserted into a photograph album or frame, and discloses an acoustic recording medium of an electronic chip embedded in a paper laminate of a photograph. Playback of the sound can be made by the same camera which captures the image and sound, or through a separate photo album or frame. U.S. Pat. No. 4,270,854 discloses a further variant of instant film having a magnetic sound recording strip, and recording mechanism, whereby after recording sound information, together with a photograph image, the sound recording can be reproduced, played back by the camera, or erased. U.S. Pat. No. 5,276,472 discloses a further variant of sound recording utilising parallel tracks in a magnetic recording layer on a film, and in which a camera system having a micro-controller controls recording of audio sound clips to one or a plurality of magnetic strips.

WO 00/48388 discloses a digital camera for capturing sound passages as well as still images, and allows for a flexible construction of sound and image composites representing a user's experience at the time of capture of a photograph image. One or more sound passage files form a link to a group of sound passage files, and the user interface can selectively link still images with one or more sound passage files, or unlink images with sound passage files, according to a user's preference. Mixtures of sound passage files with image data can be carried out using the user interface. Further, matching of different views of image data with different sound passage files can be carried out. In WO 00/48388, generally a single type of sound is associated with a single photograph.

WO 00/03299 discloses a self-contained data storage device capable of storing audio data, comprising a flash memory, EEPROM or PROM, and is intended for use in storing audio data relating to a photograph image.

More recently, digital still cameras and digital camcorder devices have appeared, which in the case of camcorders are capable of taking still images as well as video clips, and recording sound data at the same time as a still image or video clip. In the case of camcorders, a video clip is recorded contemporaneously with background sound, and individual frames of the video clip can be viewed on a separate screen. Recent camcorder devices are now the size and weight comparable to digital cameras for taking still images, and prices of such devices are comparable to the extent that a prospective purchaser of a still image camera may well select a camcorder device as a direct alternative.

Much of the prior art is concerned with the mechanics of capturing a sound, immediately before, at the same time, or immediately after the time of capturing an image.

Although there are many types of photograph which provide for recording of sound at or near the time of capture of the photograph, the manipulation and editing of recorded sounds and association with photograph images after the time of capture is not well addressed in the prior art.

Current prior art technology for audio photography such as it exists, usually allows for only a single type of sound to be associated with a photographic image. Although there are several disclosures of individual photographs having associated sound recording media, the presentation of photographs after they have been taken is a relatively neglected area in the prior art. A known prior art photograph album available from Brookstone Ltd supports the recording of sound clips with individual pages of an album. Details of such photograph album are available from Brooksone's Ltd. website. However, this technology deals with the association of a single layer of audio with image data.

Prior art multi-media sound and video editing software exists to allow the construction of complex multi-layered sound files, and their playback in time to a sequence of images. However, these software packages are typically hard to use for the consumer, are not tailored to photograph albums and do not allow arbitrary re-selection between layers at playback time. They also require the use of a personal computer or like computer.

EP 01,056,094 discloses a semi-conductor memory card, playback apparatus and recording apparatus for storing a plurality of audio object files and picture object files. Default play list information and sets of play list information show orders in which audio objects are to be reproduced. However EP 01,056,094 refers to a plurality of image and audio objects working together. The disclosure relates to the automatic presentation of displayed lyrics in time with karaoke music tracks and deals with how an image and audio object are associated and played or viewed in turn during the course of a play list or "play back route". The disclosure uses pointers within audio information to specific image objects.

Various recording devices for recording data with a book are disclosed in U.S. Pat. No. 6,167,233 and WO 00/13159. In the case of U.S. Pat. No. 6,167,233, the disclosure uses a variety of techniques for selecting one of a number of discrete audio files relating to a single image or page, and for labeling each file with a written label. As such, its organization of time and audio data is flat.

In EP 99 301045.3 "digital camera with sound recording", there is disclosed a method of supporting a plurality of images and sounds, where there is not just one sound for one image, but multiple images for a same piece of sound, or multiple sounds for a same image.

Prior art sound and video editing packages allow for manipulation of image data together with sound data. Many video editing packages support the notion of multi-media channels for editing and allow users to combine multiple audio and image streams. However, such packages have a cost and difficulty of use which makes them unsuitable to application for photograph albums, and actually represents a barrier to the adoption of an audio photo format, because they cannot be used to author physical versions of photograph albums.

An electronic or printed photograph album which allows multiple audio tracks to be associated with a single image over a period of time extending from or around the time of capture of an image, to an arbitrary time thereafter does not, to our knowledge, exist in the prior art.

The present disclosure addresses a new type of user interface for storage, presentation, and manipulation of image data and audio data.

SUMMARY OF THE INVENTION

Specific embodiments according to the present invention aim to provide an extensible audio photograph format which allows for each of a plurality of photograph images an unlimited number of associated audio layers, and the provision for an unlimited number of audio segment extensions to each layer.

Embodiments of the invention provide an easy to use format, suitable for mass-market consumer use.

Additionally, specific features of the present invention introduce the notion of an hierarchy of photograph images, in the form of a layered lattice, where a lower level of the lattice represents individual photos and higher levels of the lattice represent themed collections of individual images, each of which can have its own audio layers and audio segments. There is disclosed the concept of a hierarchy of photographs ordered in a lattice, for example in the form of an inverted photograph lattice, where a lower level in the lattice represents individual photographs, and higher levels of the tree represent collections of photographs arranged according to a theme. Each collection of photographs can have its own audio layers and audio segments. Each themed collection may be indexed according to a first photograph in a collection of photographs.

Methods and architectures of an audio photograph disclosed herein can be applied over a wide range of products, for example to a hand held viewer device, a computer based editing suite, a virtual electronic photograph album, or a virtual electronic photograph frame, or an audio enabled physical photograph album.

In one specific embodiment according to the invention, a plurality of streams of audio files are semantically related to an image data file.

Specific aspects of the present invention provide an audio photograph format which allows a potentially unlimited or arbitrary number of layers of audio data to be associated with an image data file. Each audio data layer comprises a plurality of audio data segments. The audio data segments are preferably numbered in the chronological order in which they were originally recorded. The logic underlying the format might be represented in a future photo file format, for example a future version of JPEG, and may be utilized by photographic album software or hardware, or a wide range of devices which manipulate audio or photographic data.

Specific aspects according to the present invention include a logical format for capture, storage and manipulation of an audio photograph which allows a plurality of audio layers to be associated with an image data, and a data architecture for an audio photograph.

Further, specific embodiments include a hierarchical architecture of a plurality of audio photographs having different levels, whereby audio photographs can be arranged or grouped into sets of audio photographs, such that within a set, a plurality of audio photographs can be collected according to a similar theme and the set can have its own audio layers and segments.

Various embodiments, include software for controlling a digital camera or camcorder for collection of audio photographs according to the disclosed format, photograph albums constructed for display, storage and manipulation of audio photographs, according to the disclosed format; and software downloadable to a generic computer device, for example a personal computer (PC) for manipulation of audio photographs according to the disclosed format.

According to a first aspect of the present invention a method of storing image data and audio data comprises:
  storing image data representing an image;
  defining a plurality of audio layers, each said audio layer comprising at least one audio segment data; and
  storing a plurality of individual audio data segments in said layers,
  wherein said plurality of audio segments are related to said image data.

According to a second aspect of the present invention a method of editing an audio photograph including image data representing an image, and a plurality of audio layers, each said audio layer capable of containing at least one audio segment data, said editing method comprising the steps of:
  selecting said image data;
  selecting an audio data segment;
  comparing a semantic content of said audio data segment with a semantic description of each of a plurality of said audio layers; and
  selecting a said audio layer having a data type definition closest to a data content type of said audio segment data; and
    storing said audio segment data in said selected audio layer.

According to a third aspect of the present invention there is provided a method of editing a plurality of audio photographs, wherein each audio photograph includes:
  image data; and
  a plurality of audio layers having audio associated with said image data;
  said method comprising:
  displaying a plurality of said images on a display screen;
  selecting individual ones of said images;
  grouping individual ones of said images together to form one or a plurality of groups of said images; and
  displaying a plurality of audio layers associated with said first level display, each of said audio layers capable of containing at least one audio segment data.

According to a fourth aspect of the present invention there is provided a data format for an audio photograph, wherein the audio photograph includes:
  at least one image data; and
  a plurality of audio data segments;
  said format comprising:
  a first file location, said first file location assigned for storage of said image data file; and
  a plurality of audio segment data file locations, said plurality of audio segment data file locations arranged as a plurality of audio layers, wherein each said layer comprises a set of said audio data segments.

According to a fifth aspect of the present invention there is provided a method of playback of an audio photograph, said audio photograph including:
  image data; and
  a plurality of audio segments arranged in a plurality of audio layers, wherein each said audio layer includes audio data segments of the same data type, said method comprising:
    playing a first plurality of data segments corresponding to a first audio data layer, said first plurality of data segments including data content of a first data type; and
    playing at least one other said audio data layer that includes another plurality of audio data segments having data content of another data type.

According to a sixth aspect of the present invention there is provided a method of editing an audio photograph, said audio photograph including:
   image data;
   a plurality of audio layers, each said audio layer capable of having at least one audio segment data;
   said method comprising the steps of:
   selecting said audio photo by selection of said image data;
   playing audio data included in one of said audio layers;
   during said playback of said audio data, adjusting a volume control; and
   recording volume data corresponding to said audio data in response to adjustment of said volume control.

According to a seventh aspect of the present invention there is provided a photograph album capable of storing a plurality of audio photographs, wherein one of said audio photographs including:
   an image; and
   at least one audio segment data including audio data associated with said image;
   said photograph album comprising:
   a display region for displaying a plurality of images; and
   an audio system for storing a plurality of audio segments, wherein said plurality of audio segments are arranged in a plurality of audio layers, wherein each of said audio layers includes audio segments of an audio data type different from the audio segments of each of the other layers.

According to an eight aspect of the present invention, there is provided a photograph album capable of storing a plurality of audio photographs, wherein one of the audio photographs includes:
   an image; and
   at least one audio segment data including audio data associated with said image;
   said photograph album comprising:
   a display region for displaying a plurality of images; and
   an audio system for storing a plurality of audio segments, wherein said plurality of audio segments are arranged in a plurality of audio layers, wherein each of said audio layer includes audio segments of an audio data type different from the audio segments of each of said other layers.

According to a ninth aspect of the present invention, there is provided a photograph album capable of storing a plurality of audio prints, wherein one of said audio prints includes:
   a printed image; and
   at least one audio segment including audio data associated with said printed image;
   said photograph album comprising:
   a display region for displaying a plurality of said printed images; and
   an audio system for storing a plurality of audio segments, wherein said plurality of audio segments are arranged in a plurality of audio layers, each said audio layer including audio segments of an audio data type different from audio segments of each said other layer.

According to a tenth aspect of the present invention, there is provided a method of storing physical printed images, and associated audio data, said method comprising:
   storing at least one of said physical printed images;
   defining a plurality of audio layers, each said audio layer comprising at least one audio segment, said audio segment comprising a self-contained item of audio; and
   storing a plurality of individual said audio segments in said plurality of layers, wherein said plurality of audio segments are related to said physical printed image.

According to an eleventh aspect of the present invention, there is provided a service for providing a plurality of audio prints for use in a photograph album, wherein one of said audio prints includes:
   at least one physical printed image; and
   a plurality of audio segments that are arranged as a plurality of audio layers, said service comprising:
   receiving a plurality of image data, each said image data representing an image;
   generating a plurality of audio layers, each said audio layer capable of storing at least one said audio segment;
   printing said printed image; and
   providing said plurality of audio layers as electronic data.

According to a twelfth aspect of the present invention, there is provided a service of producing a plurality of audio photographs, wherein each of said audio photographs includes:
   image data; and
   a plurality of audio segments arranged as a plurality of audio layers, said service comprising:
   receiving a plurality of said image data, each said image data representing an image;
   generating a plurality of audio layers, each said audio layer capable of storing at least one said audio segment;
   providing said image data as electronic data; and
   providing said plurality of audio layers as electronic data.

BRIEF DESCRIPTION OF THE DRAWINGS

For a better understanding of the invention and to show how the same may be carried into effect, there will now be described by way of example only, specific embodiments, methods and processes with reference to the accompanying drawings in which.

DETAILED DESCRIPTION

In the following description numerous specific details are set forth in order to provide a thorough understanding. It will be apparent however, to one skilled in the art, that the present invention may be practiced without limitation to these specific details. In other instances, well known methods and structures have not been described in detail so as not to unnecessarily obscure the description.

In this specification and claims the term "audio photograph" describes a data format that represents at least one still image and at least one audio clip.

In one embodiment of a digital photograph album software, individual audio photographs are imported within an initial layer of ambient sound recorded at the time of capture of a photographic image. The sound is encoded in a first audio layer (audio layer 1) of the audio photograph and played by default when a photograph image is viewed. Subsequent sounds can be recorded or imported as additional segments within the first audio layer, or into additional audio layers, for example audio layers might be designed by a user to correspond to different types of sound such as ambient, music, commentary, recorded conversation and so on. Each layer comprises a plurality of audio segments. Audio segments may be designed to correspond to individual recordings of each sound type, such as one music track, followed by another music track. Audio segments and audio layers are extensible. Because of the extensible nature of the audio segments and audio layers, further recordings of the same type of audio, or a new type of audio can be added to an audio photograph over its lifetime, causing the audio photograph to become more complicated and full. Subsequent segments within a layer can play consecutively, while subsequent layers may be switched on or off as play back settings. Layer settings can be shown as simple check box icons or buttons which can be toggled on or off by user. Software for a digital photograph album allows multiple layers to be selected simultaneously, with some control over the relative loudness of each layer at playback.

Figure 1:
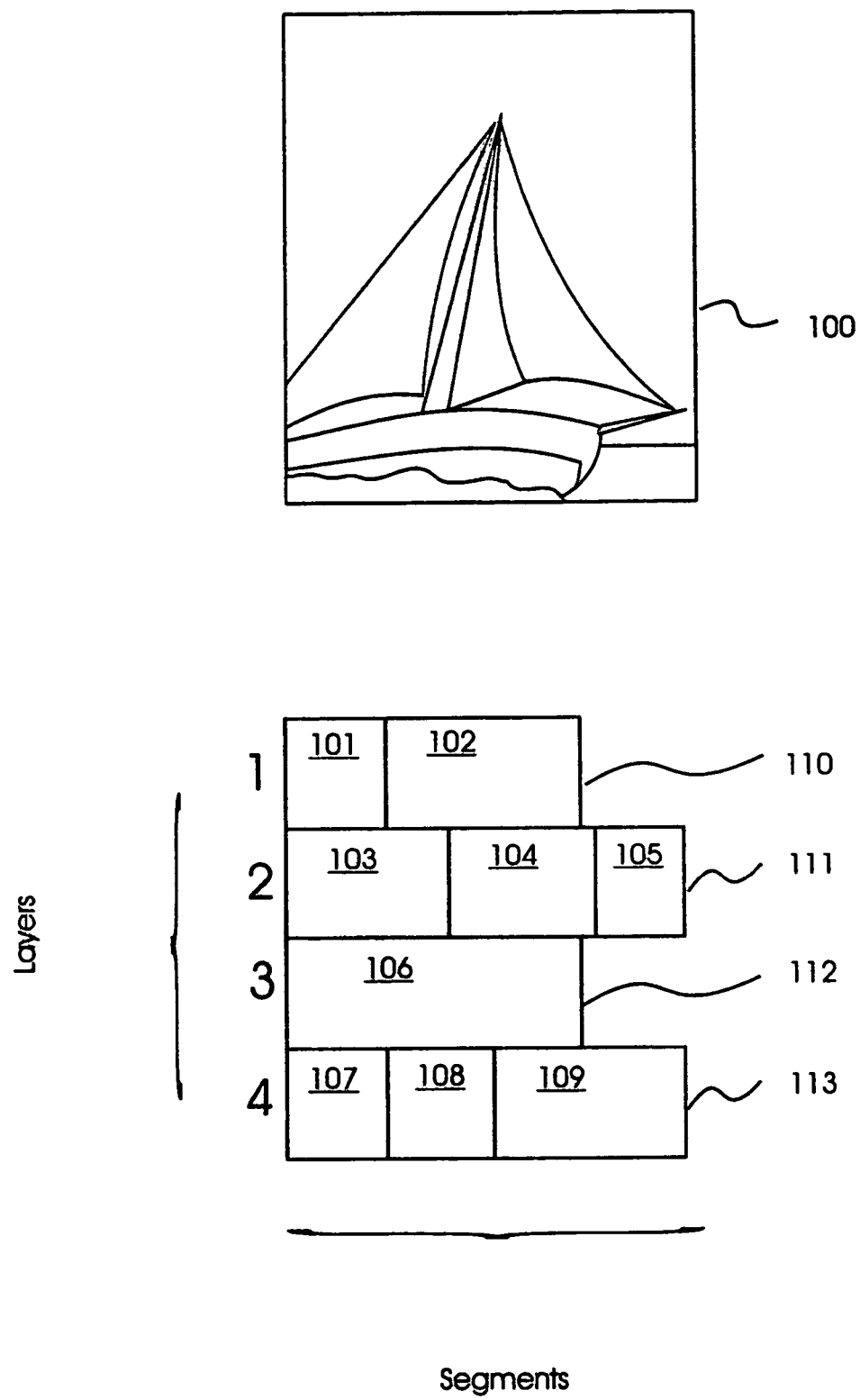
FIG. 1 is a schematic diagram of an audio photograph according to a first specific implementation of the present invention.

The audio photograph of FIG. 1 comprises a block of image data 100, representing a still image, and a plurality of audio data segments 101-109, arranged in a plurality of layers 110-113. Each of audio layers 110-113 comprises one or a plurality of segments for containing audio data.

Each of audio segments 101-109 comprises a recorded or imported audio data file, including audio data of any type. Types of audio data include narrative data, describing a subject of the image data 100; catalogue data, describing information useful for cataloguing an image data, for example data of the form "this photograph was taken on 25 March", "this photograph was taken in dim light at 7.00 pm" or the like; context specific sounds, for example ambient sound recorded at a time an image subject of the image was recorded; or retrospectively recorded sound, for example the sound of a group of users discussing or commenting on a photograph image, for example at a time after image capture.

In a product embodying the audio photograph architecture of FIG. 1, a manufacturer or designer of the product can specify that individual layers correspond to individual types of audio data. For example, a first layer can be reserved for music data, a second layer can be reserved for ambient sound, a third layer can be reserved for conversation, and so on.

Within the architecture, each individual layer is arbitrarily extendible by addition of further audio segments, allowing new recordings of audio data to be added to the image data over its lifetime, and the audio photograph as a whole to grow in richness and meaning.

Figure 2:
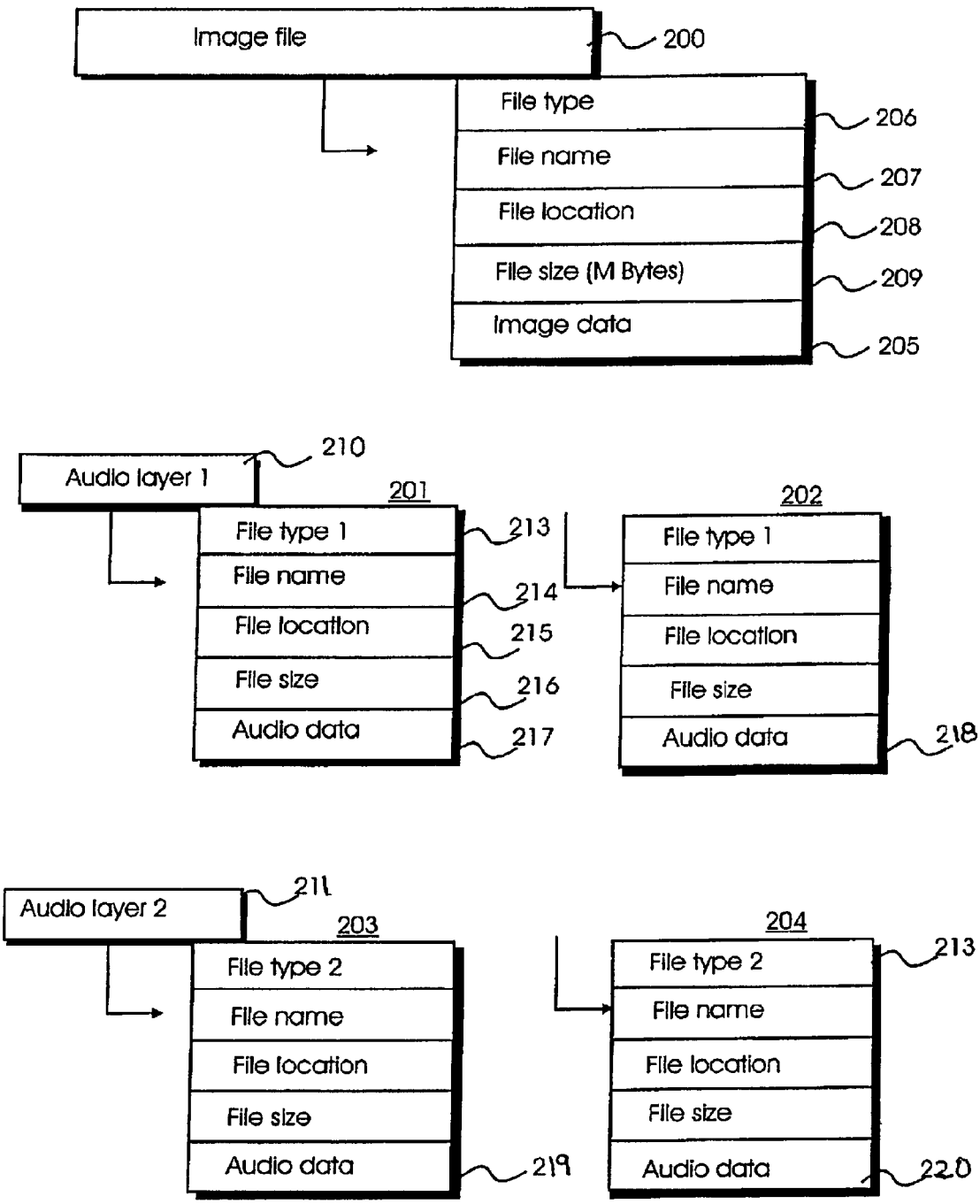
FIG. 2 is a schematic diagram of a file organization of the audio photograph of FIG. 1.

Referring to FIG. 2 herein, there is illustrated schematically a file organization of the audio photograph of FIG. 1. The audio photograph file comprises an image data file 200, and a plurality of audio segment data files 201 to 204 each containing a segment of audio data An image data file 200 comprises an image data payload 205 comprising the image data itself representing an image; a plurality of headers comprising a file type header 206, being an assignable field describing a type of image data file; a file name 207; a file location 208; and a file size indicator 209.

The file type header 206 can be user assignable with a user defined identifier data. For example a user may wish to define the image file as being "nautical", or by any other descriptive text which indicates a subject matter content of the image data.

Associated with each image file, is at least one audio layer 210 and preferably a plurality of audio layers 210, 211. Each audio layer comprises one or more audio segments 201-204. Each audio segment comprises an audio data file 217-220, being a payload of the segment and being convertible into a sound and a header comprising; a file type field 213, being a user definable descriptor of the type of audio data stored; a file name field 214; a file location field 215 and a file size field 216.

The file type field 213 is assigned to contain semantic name data by a user. For example an audio segment of a first audio layer can comprise a file type data 213 of "music". All audio segments 201,202 within the first audio layer 210 typically have a similar or same semantic file type identifier 213, such that all music associated with the image file 200 is contained in a first audio layer 210. Similarly all conversation items are typically contained in a second audio layer 211, wherein each audio data file 219, 220 having a conversation content is assigned a file type data 213 having the semantic "conversation".

There are four main types of sound which a user is likely to wish to support using the audio picture of FIG. 1, each of which can be assigned to a different audio layer, these being:

ambient sound, being sound recorded by a camera at the time of recording image data;

music, typically recorded after image data have been captured, or imported into the audio layers after the image data have been captured;

story commentary, being human voice audio, recorded or imported into the file format typically after capture of the image; and conversation, typically a person recording their voice, in the context of discussing the photographs with a friend or other person.

In general, the sound types are semantically linked by virtue of their association with the image data because the sound types all relate to the individual image contained in the image data, and the specific data recorded has individual meaning and a semantic association in relation to an image subject of the image data within the audio photograph.

Each audio layer can be optimized for storage of audio data of different types. For example, an audio layer assigned for storing music data, can be optimized to store data via a compression algorithm suited to storage of music data. Similarly, other layers, assigned for storing other types of audio data, can be optimized by compression algorithms which are selected to be optimum for that particular type of audio data.

Figure 3:
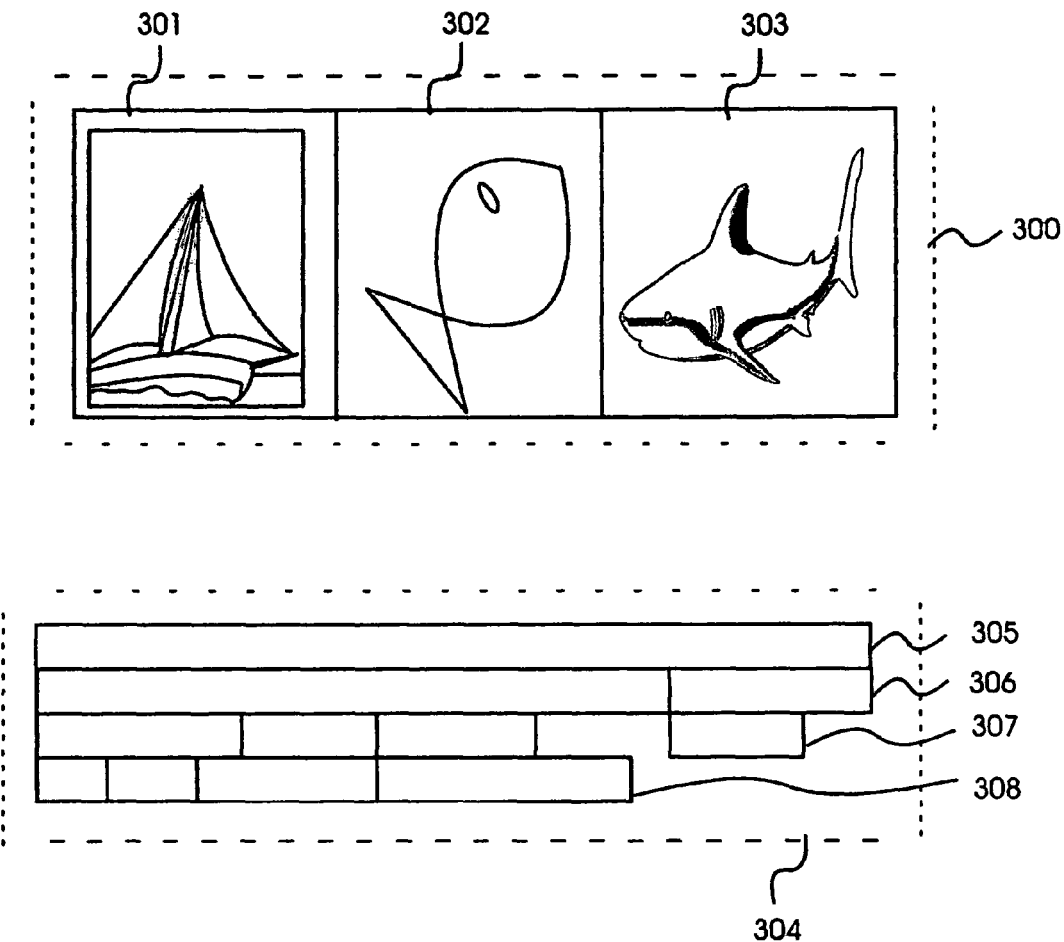
FIG. 3 is a schematic diagram including a grouping of a plurality of audio photographs of FIG. 1.

FIG. 3 includes a specific example of a group of audio photographs that comprises an image file array 300 including a plurality of individual image data files 301-303; and an audio data section 304 including audio layers 305-308. Within the plurality of audio layers 305-308, audio segments are arranged in a user definable order. For example audio segments can be arranged sequentially within a layer, in order of date of capture of audio segment.

The group of images comprising file 300 includes a plurality of individual images 301-303 that are linked semantically. In the example of FIG. 3, the semantic connection between images 301-303 is a nautical theme.

Individual audio layers 305-308 respectively are linked semantically to the plurality of images 301-303. For example a first layer 305 comprises one or a plurality of music sound tracks, based upon a nautical theme. A second audio layer 306 comprises ambient sound captured in a nautical environment, for example the sound of a ship sailing and underwater sounds, including for example diving sounds. A third audio layer 307 comprises commentary recorded or imported after capture of images, again upon a nautical theme, and commenting on individual images 301-303. A fourth layer of audio 308 comprises conversation recorded in the context of a group of persons discussing or viewing images 301-303.

In general, in an audio photograph group, a plurality of images are semantically linked to each other, and one or a plurality of audio layers include audio data having a semantic relationship to at least one of the images.

Figure 4:
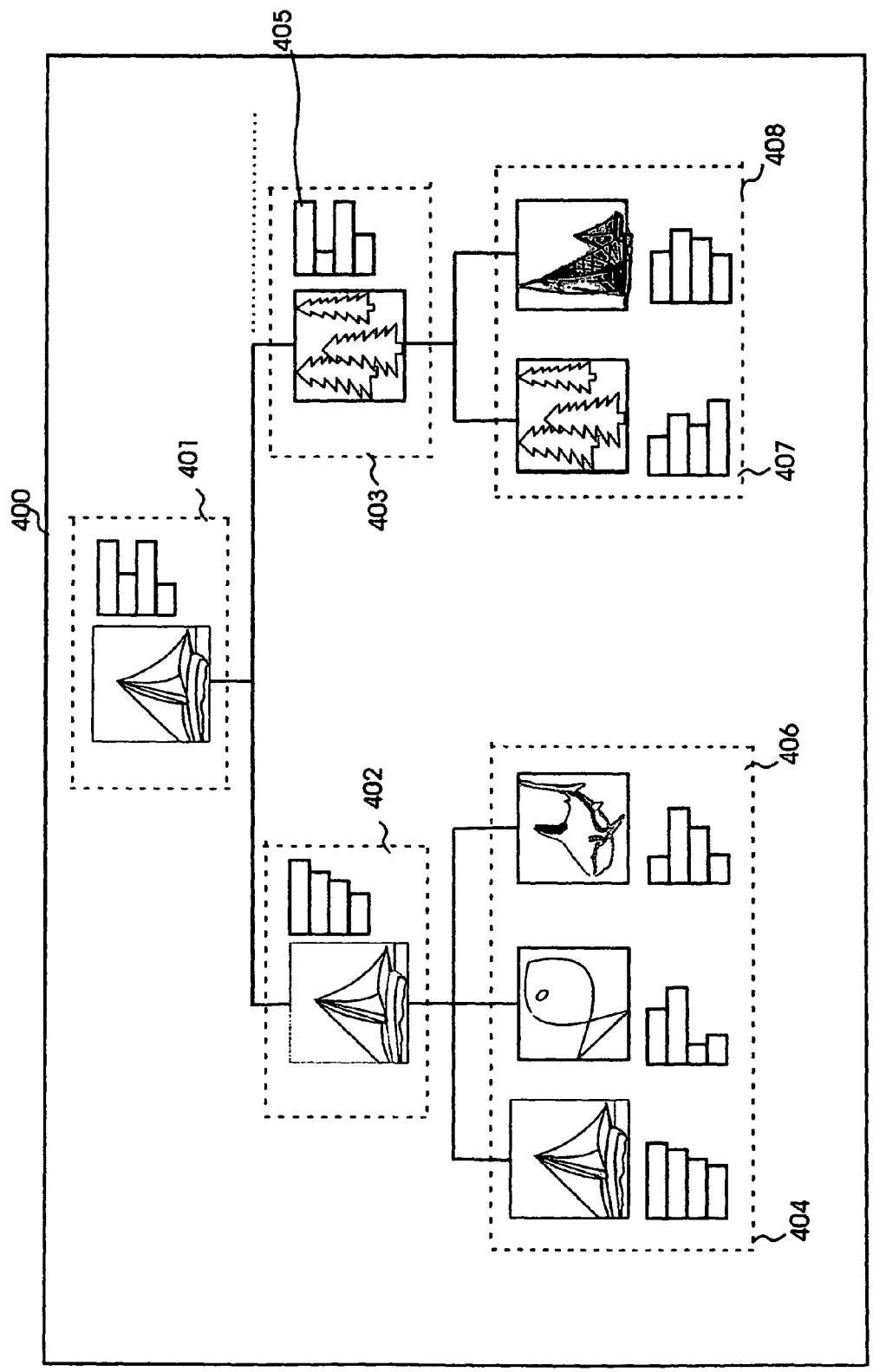
FIG. 4 is a schematic diagram of a plurality of audio photographs in an hierarchical lattice arrangement, forming an audio photograph collection.

Referring to FIG. 4 herein, there is illustrated a plurality of audio photographs linked in a lattice 400. The audio photograph lattice 400 comprises a plurality of audio photographs logically linked to each other in a hierarchical arrangement. The lattice 400 illustrated in FIG. 4 is two dimensional, but in principle could be multi-dimensional. The hierarchical structure comprises a plurality of nodes and links. At individual nodes, are stored individual audio photographs, with the links between the nodes representing logical relationships between individual nodes. A root node 401 is linked to a plurality of first level nodes 402, 403 respectively. Each first level node 402 and 403 can be linked to one or a plurality of second level nodes. In the example of FIG. 4, first level node 402 is linked to a plurality of second layer nodes 404-406. Similarly second first layer node 403 is linked to a second plurality of second layer nodes 407, 408.

Nodes within a layer of FIG. 4 are grouped, so as to form an audio photograph group as described with reference to FIG. 3. The audio photograph group of FIG. 4 comprises a plurality of second layer nodes 404-406 that are linked to a first node 402 in a next layer up, i.e. first node 402 in the first layer. Terminal nodes, i.e., nodes from which no further nodes extend at successively higher layers, form "leaves" of the hierarchical lattice structure.

The audio photograph lattice 400 illustrated in FIG. 4 is a way of retrieving audio and/or images in a photograph album, or other device storing image data and audio data. Within a photograph album, photographic still images may be semantically related to each other, for example because they were captured chronologically or at the same event. For example on an island cruise holiday, a ship may stop at various locations. In the example of FIG. 4, an image of the ship at the route node 401 is representative of a collection of audio photographs comprising a photograph lattice 400. At first layer node 403, the image of the ship is linked to an image of a coastal forest location where the ship anchored. Also, the image of the ship may be linked to a shallow beach or reef location represented by an audio photograph group comprising individual audio photographs at second layer nodes 404-406.

Individual audio photographs can be assigned nodes of the linked lattice hierarchy on the basis of chronological order in which the photographs were taken.

Associations between individual audio layers and individual images can occur at higher layers within the lattice hierarchy structure. An audio segment within an audio layer is not restricted to apply to a single image within a single audio photograph, but can also be associated with another image at the same hierarchical layer or at a different hierarchical layer, or be associated with the same image at a different hierarchical layer.

Figure 5:
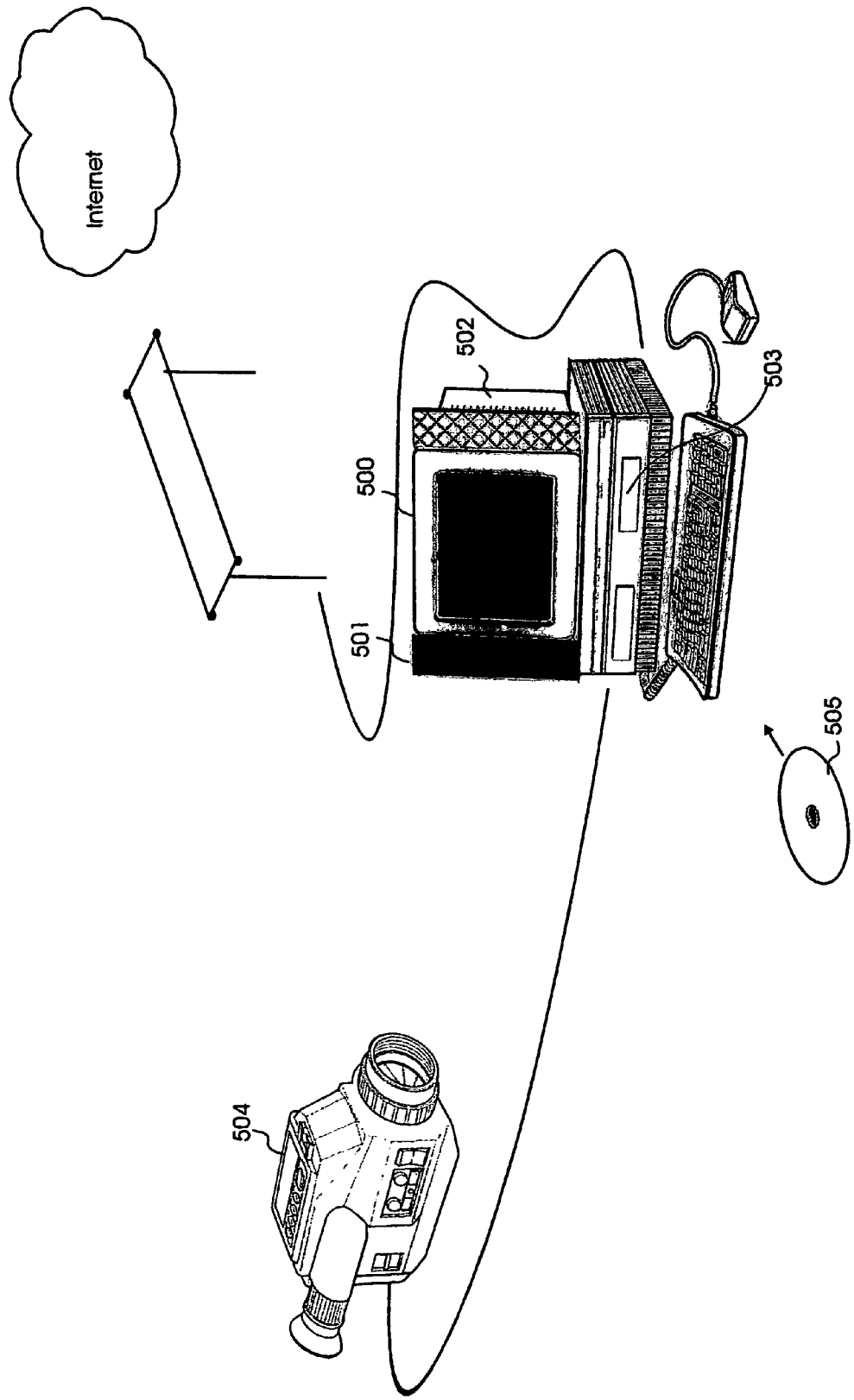
FIG. 5 is a partly perspective and partly schematic diagram of a first embodiment of an audio photograph system, for capture, storage and editing of audio photographs.

There is now described, in connection with FIG. 5, a first specific embodiment of an audio photograph viewing and editing system for the audio photographs of FIG. 1 or the lattice of FIG. 4.

Referring to FIG. 5 herein, an audio photograph editing and viewing system comprises a computer 500, for example a personal computer or the like having multi-media functionality, including a pair of audio speakers 501, 502 a CD reader 503; an input port, for example a universal serial bus (USB) port or other data entry port, for example a Firewire port for receiving audio and image data; and a port for connection to the Internet or other wide area network. Optionally the system comprises a digital camera or camcorder device 504, capable of capturing digital still image data and/or video sequence data, for example in MPEG or JPEG format and for capturing audio sound clips, taken at the same time as still image data.

Image data can be transferred from the digital camera/camcorder 504 to the computer via a universal serial bus, Firewire, Bluetooth or other communication system. Audio data in the form of pre-recorded data, for example on a CD-ROM device or in the form of an audio CD device 505, can be entered into the computer 500. Additionally, image data and/or audio data in the form of MPEG files, WAV files or other similar files can be downloaded from the Internet and stored locally on hard disk drive of the computer 500.

Figure 6:
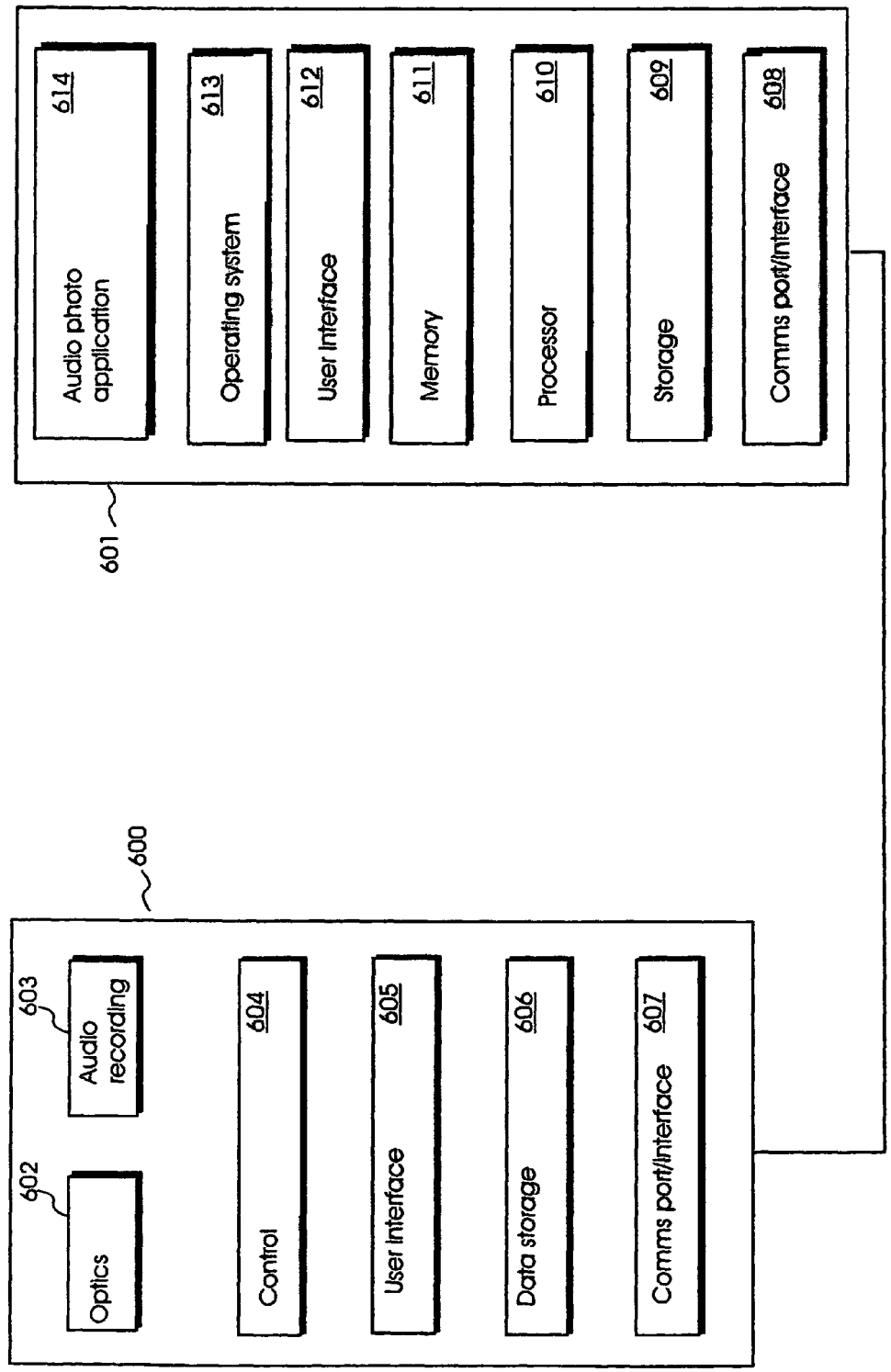
FIG. 6 is a block diagram of the audio photograph system of FIG. 5.

Referring to FIG. 6 herein, there is illustrated schematically components of a digital camera or camcorder device, and a computer.

Digital camera or camcorder device 600 (corresponding to camcorder 504) comprises an optics mechanism 602, an audio recording system 603; control components 604; a user interface 605 allowing a user to capture still images of the sequences, and capture audio at the same time as recording image data; an internal data storage device 606; and a communications port/interface 607 for communicating image data and audio data with external devices.

Computer 601 (corresponding to computer 500) comprises a communications port/interface 608 suitable for receiving audio data and/or image data; an internal data storage device 609 as is known in the art; a processor 610 as is known in the art; memory 611; a user interface 612, comprising a video monitor, an audio interface, including a set of speakers; a pointing device such as mouse, keyboard device; and video monitor capable of displaying still images and/or video sequences; an operating system 613, such as the well known WINDOWS® Operating system or LINUX® operating system; and an audio photo application 614.

Still images and/or video frequencies, together with associated audio data files can be transferred from the digital camera or camcorder 600 to the computer 601 and stored in data storage device 609 of the computer.

Within data storage device 609, audio photographs are stored in the logical format shown in FIG. 1 herein, and are compiled into audio photographic groups and lattice hierarchies, as illustrated with reference to FIGS. 3 and 4 herein. Storage and arrangement of image data and audio data into audio photograph format, audio photograph group format and audio photograph tree format, manipulation of images and play back functions are provided by audio photo applications 614.

Figure 7:
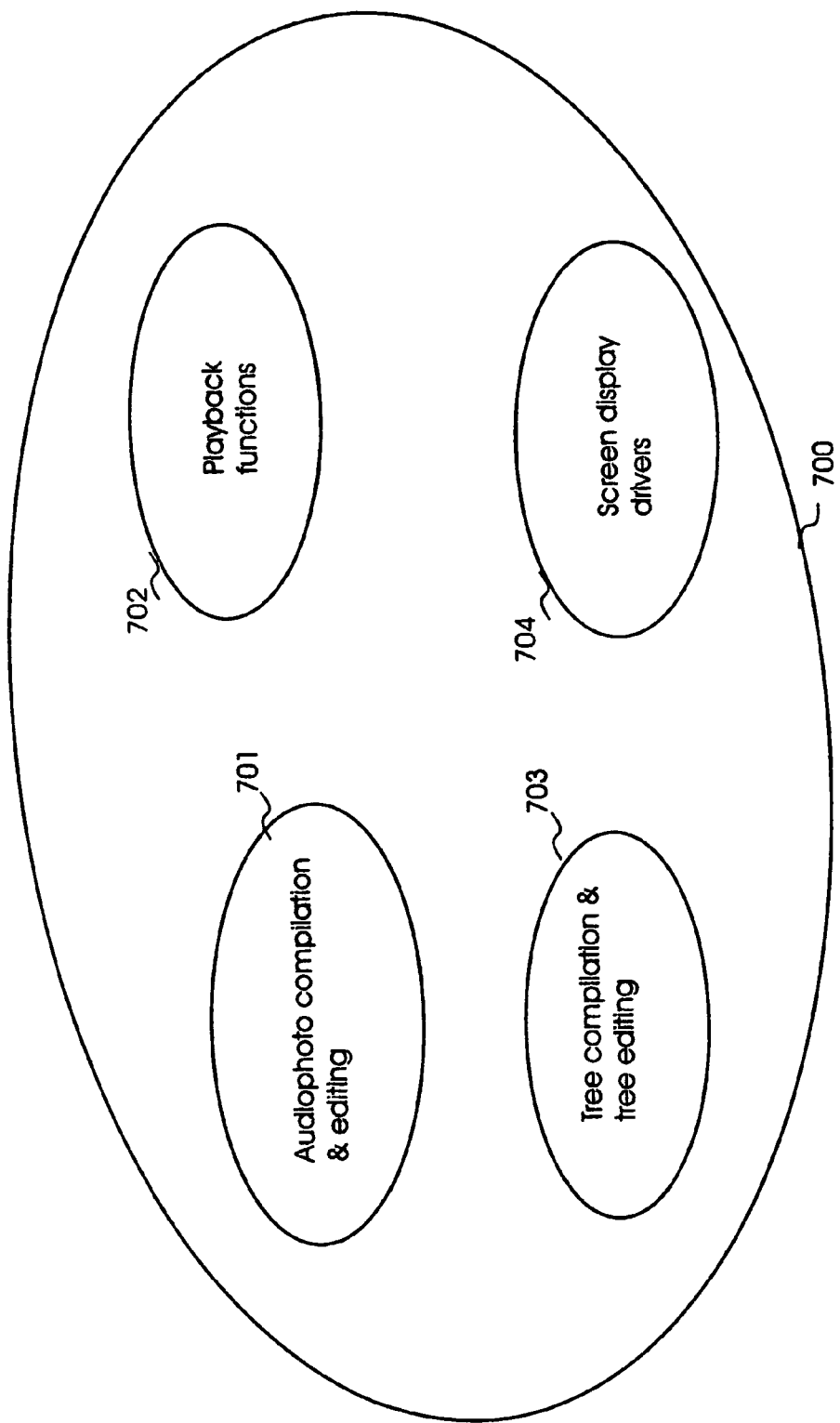
FIG. 7 is a schematic diagram of functions performed by the audio photograph system of FIG. 5.

FIG. 7 is a schematic drawing of the operations performed by the audio photo system 700, which corresponds to the system illustrated in FIGS. 5 and 6. The operations of FIG. 7 include compilation and editing functions 701 of a single audio photograph; play back functions 702 for playing back audio photographs; tree compilation editing functions 703 wherein the audio photographs are grouped as described in connection with FIG. 4 and edited; and screen display drivers 704.

Operations provided by the system include the following:

1. Setting the number of audio layers in each still image, to create an audio photograph; for each audio photograph, a user can select a number of audio layers to apply to that audio photograph. The layer structure can be pre-embedded within the system, so as to present a user with a default layer structure, for example having four layers for music, ambient sound, commentary and recorded conversation as described herein before.

2. Editing of audio segments within an audio photograph; editing is performed by a user manipulating object icons representing individual audio segments on a display screen. A user can also re-position audio segments within an audio layer, move audio segments from one layer to another, add audio segments, or delete audio segments.

3. Playback; when an image, e.g., image 100, is viewed, playback of audio layers 110-113 is initiated by a user activating a "play" icon or switch by using a mouse. Once play is activated, individual audio segments, e.g., segments 103-105, within audio layer 111, are played in sequence, in the order in which they appear in the audio layer. Playing of audio layers can be activated by the user on a per layer basis. Within each layer, audio segments start at the first audio segment of that layer and play consecutively.

4. Compilation of audio photograph groups; a plurality of images can be displayed on the screen of computer 500 at the same time, and linked to form an audio photograph group, which can be viewed as a collection. An audio photograph group is represented by a first index photograph. Audio layers for the group can correspond to the audio layers of the first index photograph. The first index photograph has its own separate layers and segments of audio, which are used to represent the group as a whole. Each group of audio photographs can have a plurality of audio layers in addition to the audio layers of each individual audio photograph.

Construction of albums of audio photographs is according to a lattice hierarchy as described herein before in connection with FIG. 4. Albums of audio photographs can be constructed by a user in an album view, comprising a plurality of layers of audio photographs. Each audio photograph comprises an image and a plurality of audio segments arranged in audio layers. Individual audio photographs can be arranged into groups, within an album view. An audio photograph system can store several albums of audio photographs at once. Each album of audio photographs, can have a separate set of audio layers, in addition to individual audio layers of each audio photograph. Alternatively, an audio layer of an individual audio photograph can be assigned to be an album audio layer, that is containing audio applying to all images in the album.

Figure 8:
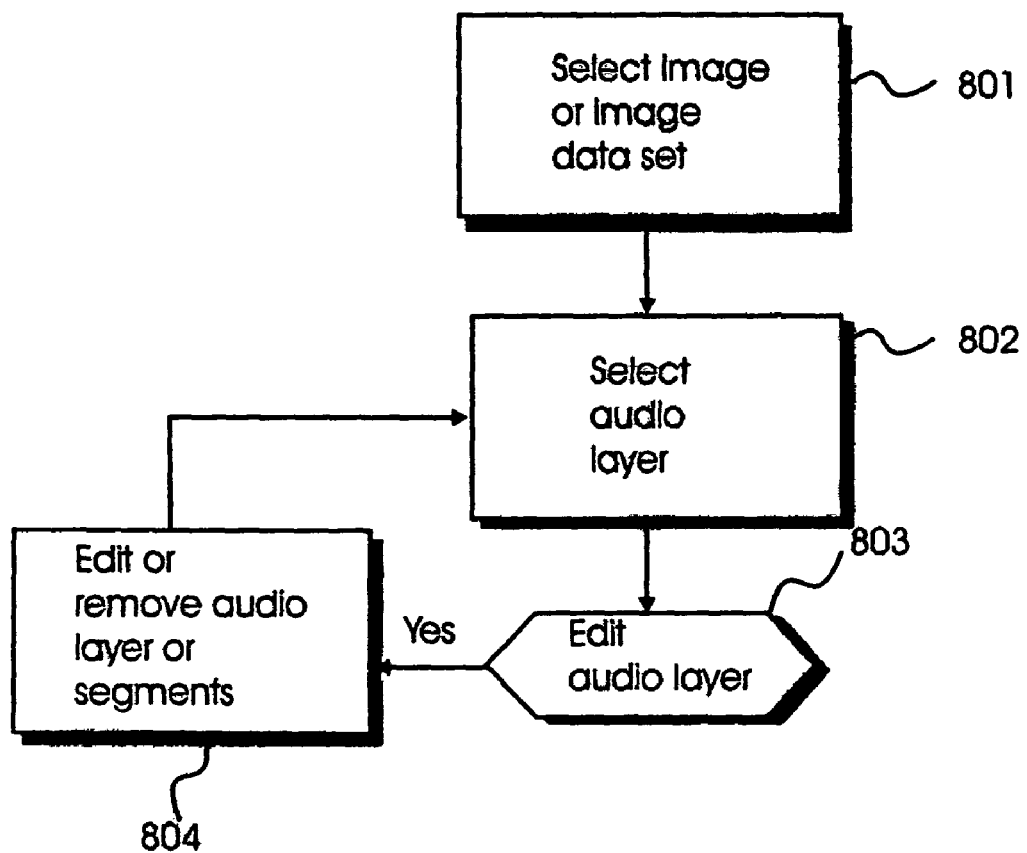
FIG. 8 is a flow diagram of steps for editing the audio photograph of FIG. 1.

FIG. 8 is a flow diagram of process steps a user performs by using the apparatus of FIGS. 5 and 6 when programmed to operate according to the audio photograph format as described herein, to have an editing function, and an audio record function. Another example of an apparatus that can perform the operations of FIG. 8 for capturing image data and audio data is a photograph album having a user interface and processing capability for editing audio photographs and recording audio data. The process steps of FIG. 8 can also be carried out by a user using a general purpose data processor, according to program instructions, or by a custom built circuit, for example an application specific integrated circuit (ASIC).

The sequence, i.e., order, of the process steps shown in FIG. 8 can be varied according to different implementation. In the process of FIG. 8, the user, during step 801, selects image data or an image data set comprising a plurality of image data files by keyboarding or mouse activation. Step 801 is equivalent to selecting an audio photograph. It will be appreciated that many different user interface configurations and menus can be implemented, in order to enable a user to perform step 801.

In step 802, the user selects an audio layer of the audio photograph. Again, many possible menu driven user interface implementations are possible for enabling the user to select an audio layer of an audio photograph, as will be appreciated by the person skilled in the art. In step 803, the user decides whether a particular audio layer is to be edited. If the audio layer is to be edited, in process 804, edits of the audio layer are performed. Editing the audio layer can include removing one or more audio segments, adding one or more audio segments, moving an audio segment from a first layer to a second layer or copying an audio segment from a first layer to a second layer. If an audio layer is not to be edited in step 804, the process finishes.

Figure 9:
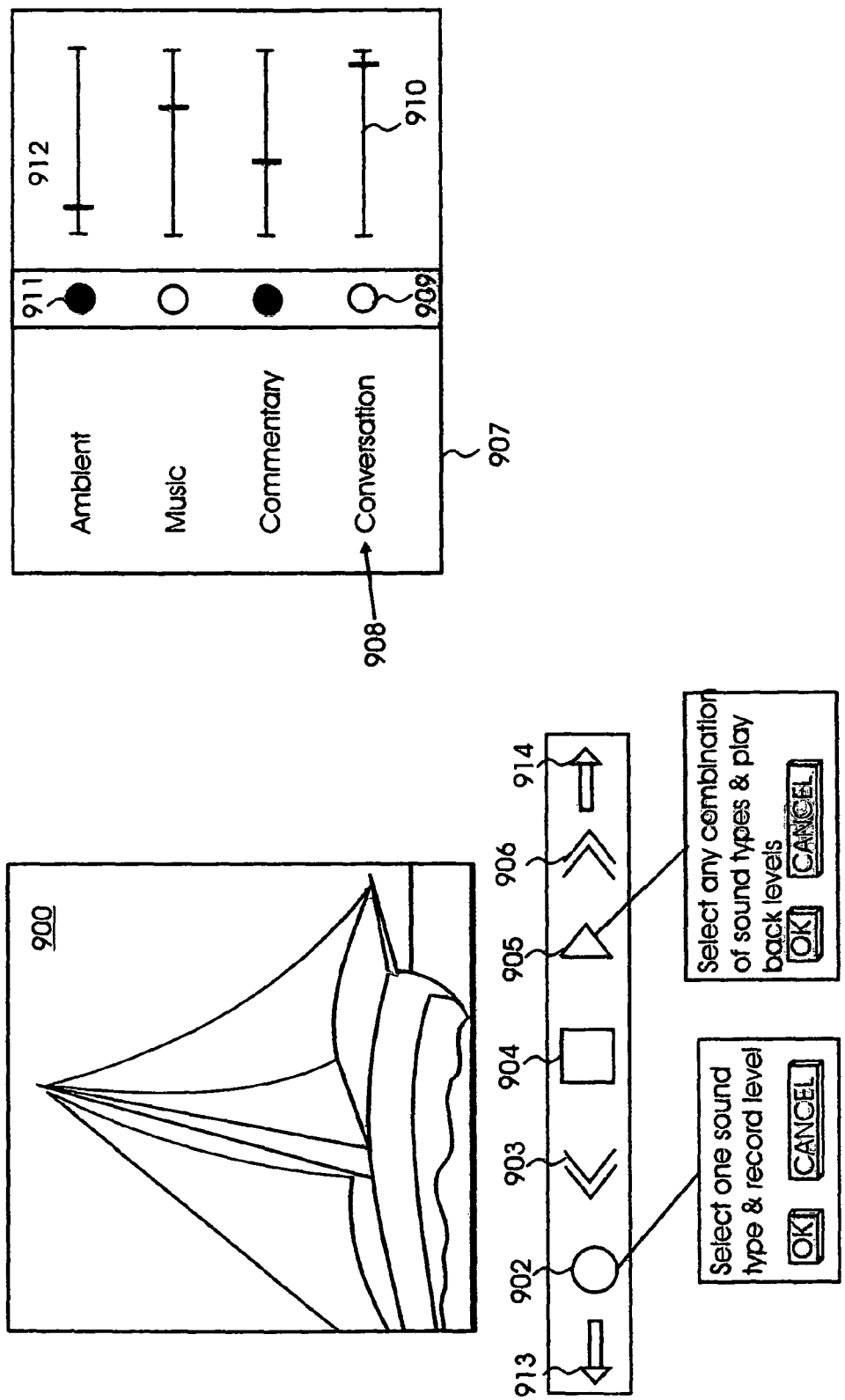
FIG. 9 is a schematic diagram of a display and operations for editing audio layers of audio photographs provided by the audio photograph system of FIG. 5.

Referring to FIG. 9 herein, there is illustrated schematically a playback view, displayed as a display on computer 500 of the editing and viewing system, for making playback settings for audio segments of an audio photograph. The screen view comprises image data 900 of an audio photograph and a transport bar display 901 located below image 900. Bar display 901 comprises individual transport icons, such as a record icon 902; a rewind icon 903; a stop icon 904; a play icon 905; and a fast forward icon 906; and a layer selection and edit display 907, to the right of image 900.

The layer selection and edit display 907 comprises a list of individual layers in the audio photograph, each layer having a semantic identifier naming the layer (i.e., ambient, music, commentary and conversation). A select/deselect icon 909 is associated with each of the layers to enable the user to select individual audio layers by using a mouse. Display 907 also includes volume control 910 which controls playback volume of a selected audio layer, acoustic fade control 911 and acoustic balance control 112.

A playback level setting operation is now described using the display interface of FIG. 9.

A user wishing to set the audio photograph such that an ambient sound layer fades in, growing in volume for a limited duration, and then fades out, receding in volume when the audio photograph is presented can toggle the selector icon 911 corresponding to the ambient layer, highlighting that icon with a mouse on screen, and then highlighting the record icon 902 with the mouse. This automatically starts playing the ambient sounds in the audio segments of the ambient layer. To control audio volume, the user translates volume control slider icon 912 corresponding to the ambient layer, by dynamically moving the icon from left to right, where left is low volume and right is high volume, as the ambient sound is played. The user can gradually increase the volume by moving the slider from left to right and then decrease the volume by moving the slider from right to left during playback of the ambient sounds in the ambient layer. Dynamically, volume information is recorded in time relationship to the played audio segments, such that when the recording is terminated by the user by using the mouse to press stop icon 904, and then played back using playback icon 905, the volume information is reproduced during playback, causing fading in of the ambient sounds, and then fading out of the ambient sounds, according to the original movement of the slider 912 during the record session.

Each layer of audio can be edited in this way. During play back, the audio layers are automatically arranged to be played back in the order displayed. For example in the display shown, the order of play back is ambient, music, commentary and conversation layers. However, because the music and conversation layers are not highlighted, only the ambient and commentary layers play in this example.

During a playback mode at any time, the user may fastforward, fast rewind or stop the playback by clicking on icons 906, 903 and 904, respectively.

At anytime during a playback or record mode, the user can activate step reverse icon 913, to step back a segment within a layer, or activate step forward icon 914, to step forward an audio segment within a layer.

Figure 10:
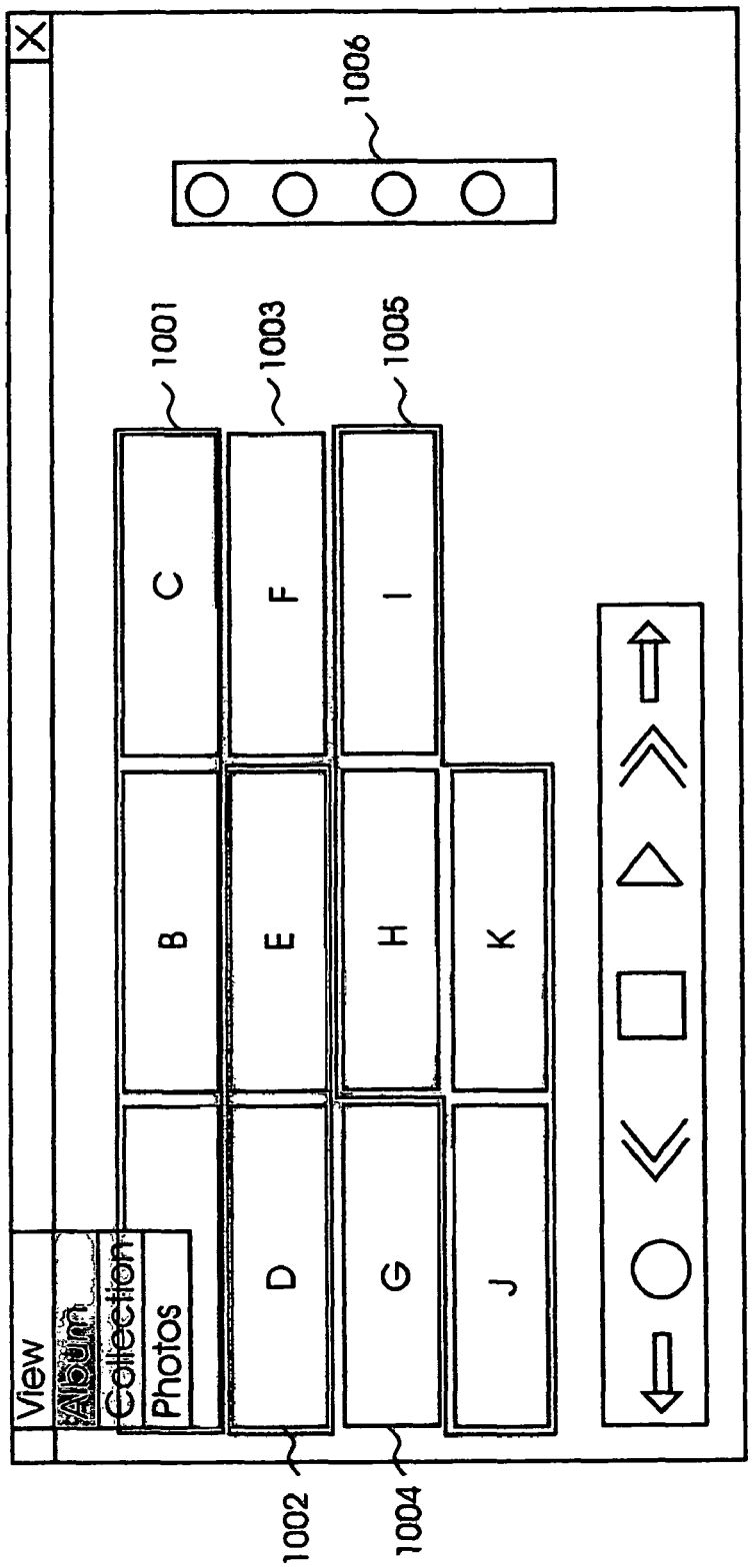
FIG. 10 is a front view of a first display for editing a plurality of audio photographs, and functionality, provided by the audio photograph system of FIG. 5.

Referring to FIG. 10 herein, there is illustrated schematically a screen display presented to a user of the first audio photograph system for arranging audio photographs within a hierarchical lattice structure in layers, as illustrated in FIG. 4. Individual audio photographs are represented by individual still images A-K, in a plurality of levels. In the example shown, four such levels are illustrated. Using a pointer icon and pointing device e.g. a mouse, a user selects groups of audio photographs in order to create audio photograph collections. In the example shown, a first group 1000 comprises a first level, a second group 1001 comprises two audio photographs from a second level. A third group comprises a single audio photograph from the second level. A fourth group comprises a single audio photograph from a third level; and a fifth group comprises a plurality of audio photographs from the third and fourth levels.

For each group, a plurality of audio layers, represented by audio layer icons 1006, is available.

Figure 11:
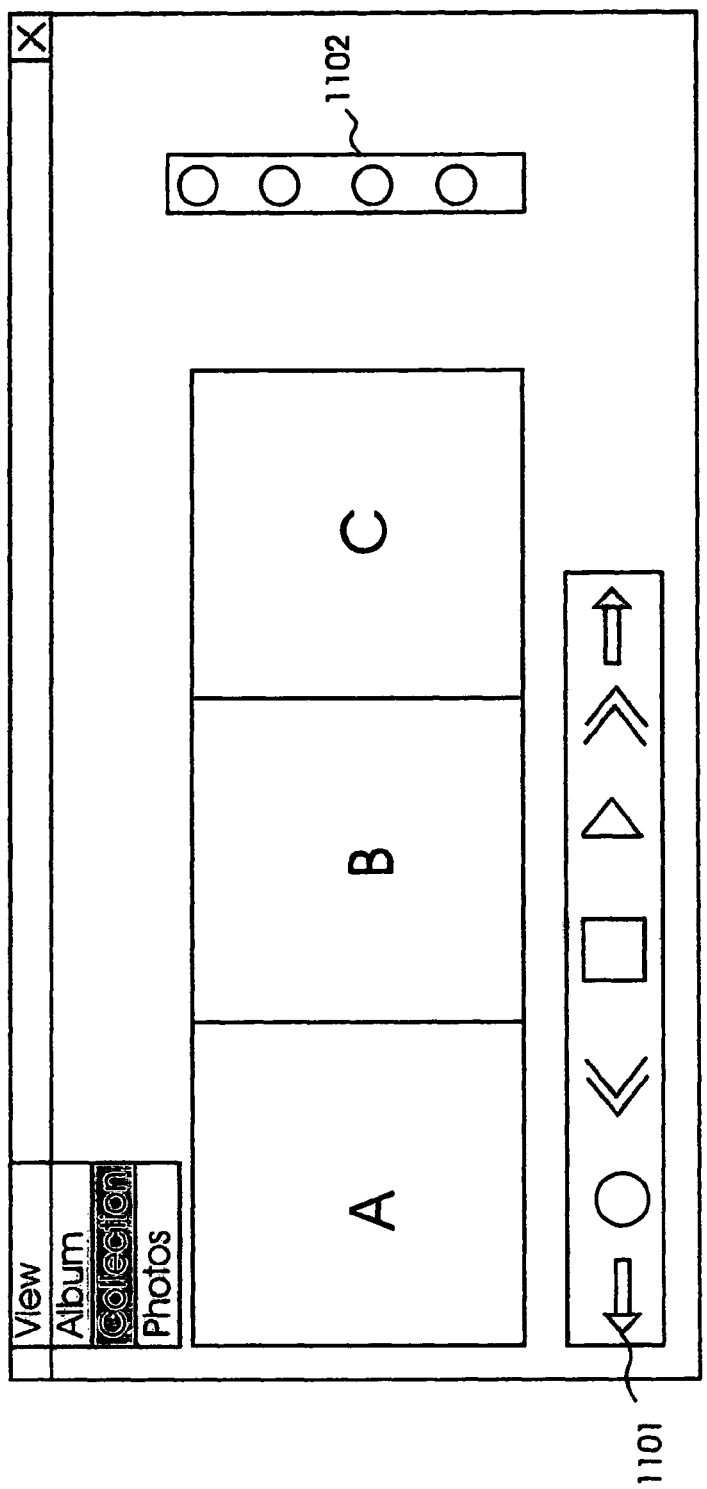
FIG. 11 is a front view of a second display for editing a group of audio photographs, provided by the audio photograph system of FIG. 5.

Referring to FIG. 11 herein, there is illustrated schematically a second screen display presented to a user of the first audio photograph system for getting a group of audio photographs. The group comprises a plurality of image data A, B, C, displayed in a single view. Individual audio photographs are represented as individual still images A, B, C. The screen display comprises a transport bar 1101 having play, stop, fast forward, fast rewind, record, step forward and step back icons or editing volume information of individual audio layers. The display also comprises an audio layer selector icon 1102, wherein each audio layer is represented by a separate icon, audio layers being selectable by activating the corresponding respective button icon using a pointer device and pointer icon. A user can select an audio layer, activate play of the audio layer, and adjust the playback volume of audio segments within an audio layer by adjusting a volume slider control (not shown in FIG. 11) for audio layer of the group.

Figure 12:
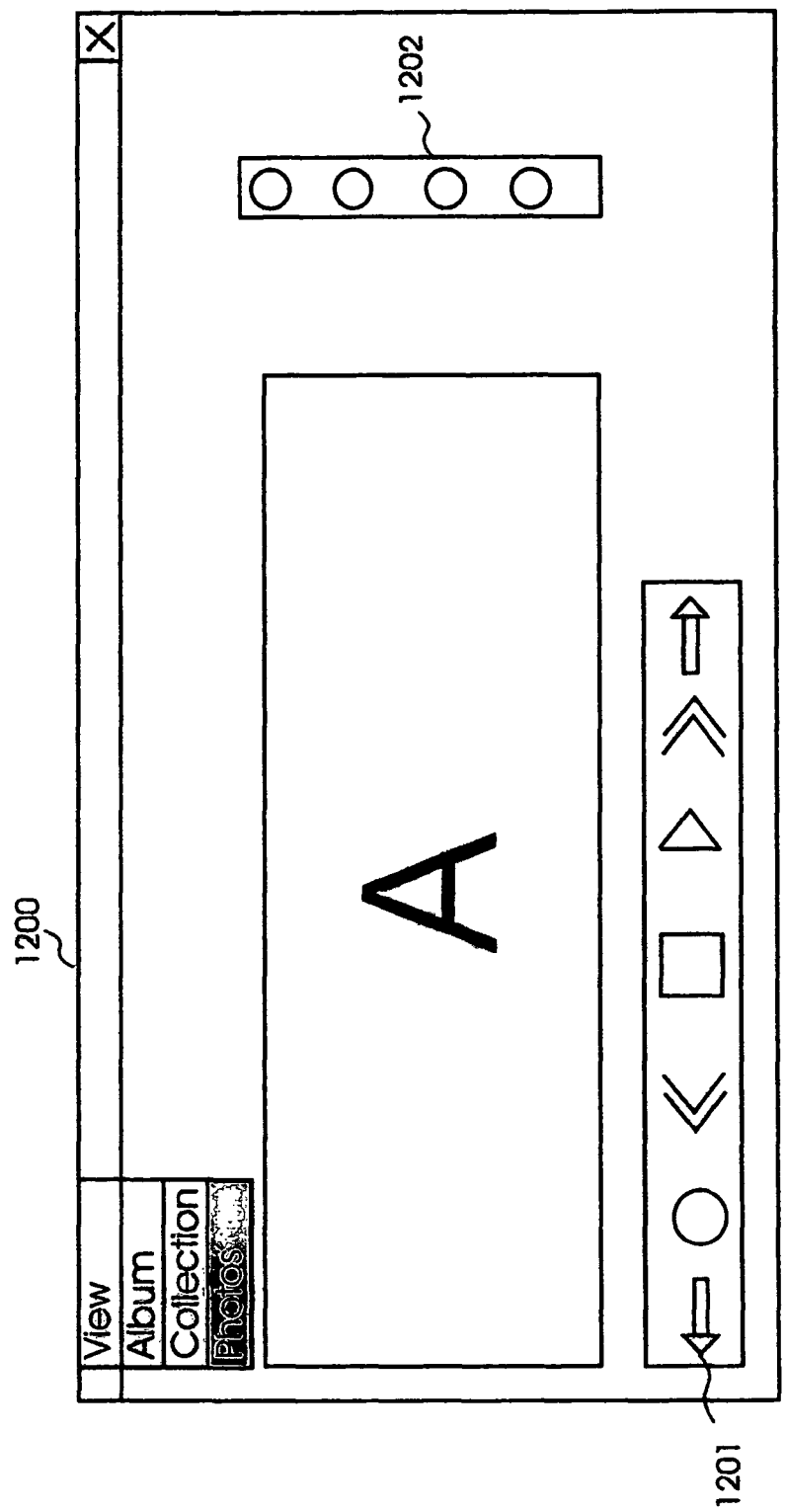
FIG. 12 is a front view of a third display for editing an individual audio photograph produced by the audio photograph system of FIG. 5.

Referring to FIG. 12 herein, there is illustrated schematically a third display view of a single audio photograph represented by a single image 1200. In the third display view, there is presented a transport bar 1201, having stop, play, fast forward, fast rewind, record, step back and step forward controls as described herein before. Additionally, there is provided a volume control slider icon (not shown in FIG. 12), and an audio layer selector icon 1202 for selection of individual audio layers associated with the displayed image.

Figure 13:
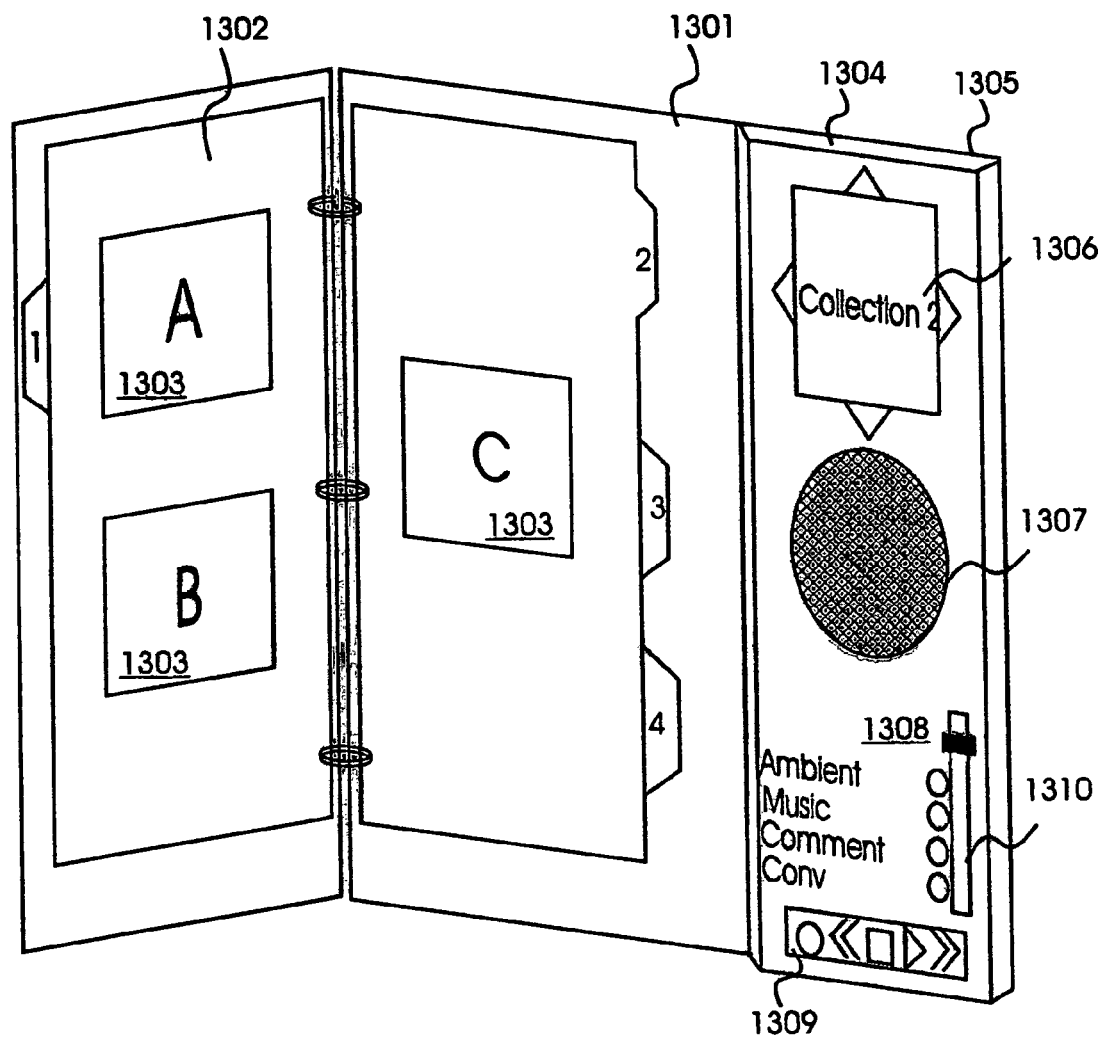
FIG. 13 is a perspective view of a second audio photograph system according to a third specific embodiment of the present invention, providing a physical audio photograph album.

FIG. 13 is a perspective view of an audio photograph album according to a second specific embodiment. The audio photograph album of FIG. 13 comprises a front cover sheet 1300; a rear cover sheet 1301; a plurality of loose-leaf pages 1302, which are insertable into the album by a plurality of ring binder connectors between cover sheets 1300 and 1301, so as to form a book having a plurality of loose-leaf removable pages upon which individual physical photograph images 1303 or sheets of photograph images can be mounted; and a control console 1304. The control console comprises an audio system for storage and editing of a plurality of audio data segments, associated with said plurality of physical photographic images.

The audio photograph album of FIG. 13 stores a plurality of audio prints; an audio print comprises a physical print of an image, and a set of corresponding audio segment data relating to that physical photograph print. Photograph prints can be individual postcard sized prints, or several prints can be printed on a sheet of paper, for example, an A4 size sheet of paper, which can be pre-punched, to fit onto the ring-binder connectors.

The control console 1304 comprises a casing 1305, for example, made from a molded plastics casing including: (1) a display device 1306 for viewing the selected audio data for individual photographic images; (2) an audio speaker 1307 for playback of audio data; (3) a plurality of audio layer selection controls 1308 for selection of individual layers of audio data; (4) a transport control 1309 comprising: (a) a record control button for enabling audio data to be recorded, (b) a rewind control button for reviewing audio data, (c) a stop control button for stopping play or recording of audio data, (d) a play control button for initiating playback of audio data, and (e) a forward control button for fast forwarding to a play position of audio data; (5) a volume control 1310 for controlling volume of audio data during record or playback; and a microphone 1311 for recording voice conversation and/or commentary of a person or persons in the immediate vicinity of the audio photograph album of FIG. 13. Each of the buttons of controller 1309, when pressed, causes closure of a switch control to supply a signal to a processor that the album carries.

In the audio photograph album, levels of audio can be assigned to individual photographic images, pages of the photograph album, sections of the photograph album, where a section may comprise a plurality of pages, or the whole album. Layers of audio can correspond to different data types of audio, for example ambient sound, music, commentary, and conversation. Users can record multi-layered albums manually by selection of an appropriate level and an audio segment by use of the control console 1304 and by activating the appropriate sound data type control 1308 prior to pressing the record control button of controller 1309.

Alternatively, users can author an entire multi-layered album by external software, before downloading the content of that album into the audio photograph album of FIG. 13.

Where audio photographs are captured by a digital camera, as digital image data and digital audio data, audio photographs can be arranged and layered using the first system described herein, before being downloaded into a physical audio photograph album as described in the second embodiment herein. Individual prints can be printed via a personal computer and printer for attachment onto the pages of the physical audio photograph album of FIG. 13. Audio data and image data can be downloaded into the physical audio photograph album via a connection, for example a USB connection, Firewire connection or similar.

Audio photographs can be stored in a hierarchical lattice arrangement in the audio photograph album of FIG. 13 substantially as described with reference to the first specific embodiment of FIGS. 5 and 6. The lattice arrangement includes individual photographs, layers of audio, where the layers of audio are semantically connected to a particular image data, groups of audio photographs and complete albums of audio photographs.

Figure 14:
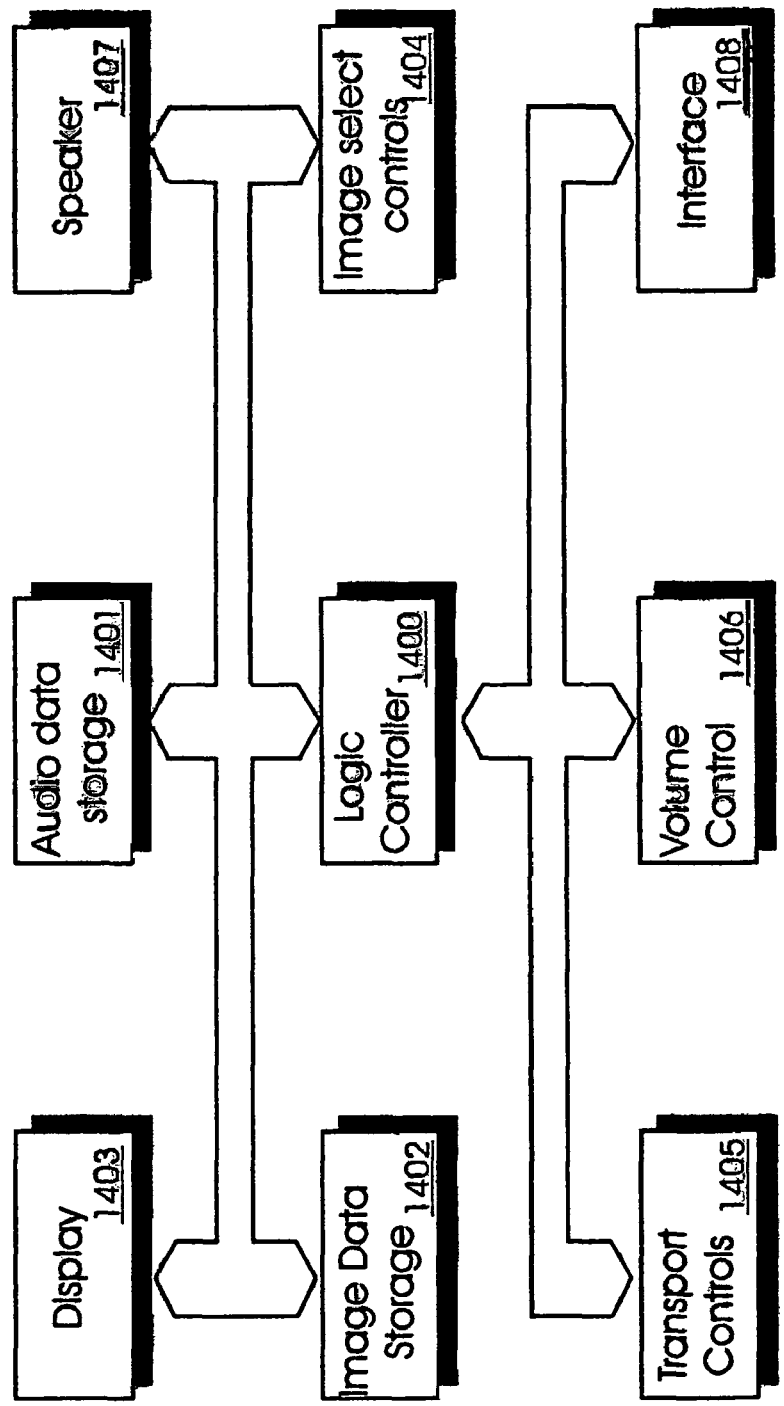
FIG. 14 is a block diagram of components of the audio photograph album of FIG. 13.

FIG. 14 is a block diagram of components of the control console 1304 of the audio photograph album of FIG. 13. The console comprises a logic controller 1400 which is preferably an application specific integrated circuit (ASIC), or a conventional processor with memory; an audio data storage device 1401 for storage of audio data segments; optionally, an image data storage device 1402 for storage of image data (the audio data storage device and image data storage device can be the same memory device); a display screen 1403 (corresponding to display 1306) for display of images and/or catalogue data for arrangement and catalogue of audio photographs; image selection control 1404, in the form of displayed icons on the display screen 1403, or as individual switch buttons provided on the casing of the controller console; audio transport control 1405 (corresponding to control 1309); an audio volume control 1406 (corresponding to control 1310); a speaker device 1407 for playback of audio data; an interface 1408, for example a USB typed interface, a Firewire interface, or a Bluetooth enabled interface for communicating with an external device, for example a personal computer or digital camera having audio record facility or a camcorder type device; and an internal bus 1409 connecting the logic controller, audio and image data storage devices, display screen, image selection controls, audio transport controls, volume control, interface and speaker. It is to be understood that control 1405 can be screen displayed touch sensitive controls displayed on display screen 1403. While control 1310 is shown as a physical slider control, in other embodiments it can be a touch sensitive slider control;

The audio photograph album also comprises a battery power supply. The components illustrated in FIG. 14 are mounted on a physical substrate card or printed circuit board contained within a plastics housing of the audio photograph album of FIG. 13.

In variations of FIGS. 13 and 14, the operations and functions described herein with reference to the first audio photo system of FIG. 5 can be incorporated into the second embodiment of FIG. 13 by configuring logic controller 1400 to perform the functions described herein before with reference to the first specific implementation.

Further, authoring and manipulation of audio photographs and groups of audio photographs can be provided as an offline service by a third party service provider.

The off-line service may provide a set of photograph prints, either postcard size, or several photograph prints on a single A4 sheet, pre-formatted for insertion into the audio photograph album, together with audio data that are downloaded to the physical audio photograph album, where the audio data are layered and semantically related to the photograph prints.

Further, in the audio photograph album of FIG. 13, audio prints can be edited by rearrangement of audio segments within layers, and regrouping of audio segments within layers, and the resultant edited groups of audio photographs converted back to a virtual domain and stored on a remote device, for example a PC, or editing software operating according to the first specific embodiment. Editing of audio prints (a physical print plus audio layers) can be carried out by a user of the physical audio photograph album for the second embodiment, and the resulting audio prints reconverted back to audio photograph format, by transmitting the edited audio layers to a remote or other peripheral device enabled by using the apparatus of FIG. 5, and already having the prestored image data from which the physical prints were generated.

Specific implementations according to the present described herein can provide an audio photograph format which allows a potentially unlimited or arbitrary number of layers of audio data to be associated with an image data file. Each audio data layer comprises a plurality of audio data segments. The audio data segments can be numbered in the chronological order in which they were originally recorded. The logic underlying the format can be represented in a future photo file format, for example a future version of JPEG, and can be utilized by photographic album software or hardware, or a wide range of devices which manipulate audio or photographic data.

Additionally, photographs are ordered in a lattice, for example in the form of an inverted photograph lattice, where a lower level in the lattice represents individual photographs, and higher levels of a tree forming the lattice represent collections of photographs arranged according to a theme. Each collection of photographs can have its own audio layers and audio segments. Each themed collection can be indexed according to a first photograph in a collection of photographs.

Specific arrangements provide a logical format for capture, storage and manipulation of an audio photograph to enable a plurality of audio layers to be associated with image data, and data for an audio photograph.

Further, specific implementations provide for a hierarchical architecture of a plurality of audio photographs having different levels, whereby audio photographs can be arranged or grouped into sets of audio photographs, such that within a set, a plurality of audio photographs can be collected according to a similar theme and the set can have its own audio layers and segments.

Various embodiments can include software for controlling a digital camera or camcorder for collection of audio photographs according to the disclosed format, photograph albums constructed for display, storage and manipulation of audio photographs, according to the disclosed format; and software downloadable to a generic computer device, for example a PC for manipulation of audio photographs according to the disclosed format.

The invention claimed is:

1. A method of storing image data and audio data, said method comprising:
    storing data representing an image; and
    storing a plurality of individual audio data segments in a plurality of audio layers, each of said audio layers comprising at least one audio data segment;
    wherein said plurality of audio data segments are related to said image data; and
    wherein said audio data segments are stored in playable and editable form in the respective audio layers such that said at least one audio data segment stored in each of the audio layers is playable and editable independently of the audio data segment or segments stored in the other audio layer or layers.

2. The method as claimed in claim 1, wherein:
    said plurality of audio layers are arranged in a hierarchical lattice arrangement.

3. The method as claimed in claim 2, wherein:
    within said lattice structure, said image data and audio data are arranged into sets of audio photographs, audio photographs within one of said sets sharing a common theme.

4. The method as claimed in claim 1, wherein:
within a said audio layer, a plurality of said data segments are stored in chronological order.

5. The method as claimed in claim 1, further including capturing at least one of said audio data segment after said image data have been captured.

6. The method as claimed in claim 1, further comprising the step of: editing at least one said audio layer by modifying a data segment content of said audio layer.

7. The method as claimed in claim 1, wherein said plurality of audio layers are stored such that each said layer stores data of a particular semantic type.

8. The method as claimed in claim 1, wherein said plurality of audio layers are stored such that individual audio layers store an audio data segment having a semantic content selected from the set;
ambient sound;
music;
voice commentary;
conversation.

9. The method as claimed in claim 1, wherein at least one said audio layer include a plurality of audio data segments which are semantically related to each other and which are semantically related to said image data.

10. A method of editing an audio photograph including data representing an image and a plurality of audio layers, each of said audio layers capable of including at least one audio data segment, said editing method comprising:
selecting said image data;
selecting an audio data segment;
comparing semantic content of said audio data segment with a semantic description of each of a plurality of said audio layers;
selecting said audio layer having the semantic description closest to the semantic content of said audio data segment; and
storing said audio data segment in said selected audio layer.

11. The method as claimed in claim 10, further comprising
selecting said audio photograph by selection of said image data;
playing an audio data segment contained in one of said audio layers at a controlled volume level;
during playback of said audio data segment, recording the volume level at which the audio data segment is played.

12. The method as claimed in claim 11, further comprising:
selecting one of said audio layers by activating a switch associated with said audio layer, and then controlling the sound volume of the selected layer.

13. A method of editing a plurality of audio photographs, each said audio photograph including:
image data; and
a plurality of audio layers including audio associated with said image data;
said method comprising:
displaying a plurality of said images on a display screen in a first level of display;
selecting individual ones of said images;
grouping individual ones of said images together to form one or a plurality of groups of said images; and
displaying a plurality of audio layers associated with said first level display, each of said audio layers including at least one audio data segment playable and editable independently of the audio data segment or segments stored in the other audio layer or layers.

14. The method as claimed in claim 13, wherein individual ones of said plurality of audio layers include audio data types different from those of each other of said audio layers.

15. The method as claimed in claim 13, further comprising:
displaying one of said groups of images on a display screen, in a second level of display;
displaying a second level of audio including a plurality of audio layers, wherein each of said plurality of audio layers stores audio data of a type that is different from a data type stored in each of said other audio layers.

16. The method as claimed in claim 13, further comprising:
displaying a further level including a single audio data;
displaying a further level of audio, said further level of audio comprising a plurality of audio layers, each of said audio layers including audio data of a type different from an audio data stored in each of other audio layers.

17. A method of playback of an audio photograph, said audio photograph including:
image data; and
a plurality of audio data segments arranged in a plurality of audio layers, wherein each said audio layer includes audio data segments of a same data type,
said method comprising:
displaying said image data together with a plurality of audio options each corresponding to one of the audio layers;
receiving user input selecting at least one of the displayed audio options; and
playing only the audio data segments stored in the audio layers corresponding to the selected audio options.

18. The method as claimed in claim 17, wherein said data type is selected from the set consisting of:
ambient data;
music data;
commentary audio data;
conversation audio data.

19. A photograph album for storing a plurality of audio photographs, one of said audio photographs including:
an image; and
at least one segment including audio data associated with said image;
said photograph album comprising:
a memory;
a speaker;
a display region for displaying a plurality of images; and
a processor arranged for storing in the memory and for playing on the speaker a plurality of audio segments that are arranged in a plurality of audio layers, wherein each said audio layer include audio segments of an audio data type different from audio segments of each of the other layers, and further arranged for displaying a plurality of images on the display region together with a plurality of audio options each corresponding to one of the audio layers;
wherein
said album further comprises an input device for receiving user input selecting at least one of the displayed audio options; and
said processor is further arranged for playing on the speaker only the audio segment or segments stored in the audio layer or layers corresponding to the selected at least one audio option.

20. The photograph album as claimed in claim 19, comprising:
a plurality of said audio layers, wherein the different audio layers store audio segments of the following audio types:
ambient sound;
music;
voice commentary;
voice conversation.

21. A photograph album for storing a plurality of audio prints, one of said audio prints including:
- a physical printed image; and
- at least one audio segment including audio data associated with one of said printed images;

said photograph album comprising:
- a display region for displaying a plurality of said physical printed images; and
- an audio system, comprising:
- a memory;
- a speaker; and
- a logic controller for storing in the memory and for playing on the speaker a plurality of audio segments arranged in a plurality of audio layers, each of said audio layers including audio segments of an audio data type different from audio segments of each of said other layers, and wherein
- said album further comprises a plurality of switches each for switching on/off one of the audio layers; and
- the logic controller is further operable for playing on the speaker only the audio segment or segments stored in the audio layer or layers switched on by the respective switches.

22. A method of processing physical printed images and associated audio data, said method comprising:
- storing at least one of said physical printed images; and
- storing, in a medium different from that of said physical printed image, a plurality of individual ones of said audio segments in a plurality of audio layers, each of said audio layers comprising at least one audio segment, said audio segment comprising a self-contained item of audio; said plurality of audio segments being related to said physical printed image.

23. A method of supplying a plurality of audio prints for use in a photograph album, wherein each one of said audio prints includes:
- at least one physical printed image; and
- a plurality of audio segments arranged as a plurality of audio layers, said method comprising:
- receiving a plurality of images;
- generating for each of said images a plurality of audio layers, each of said audio layers being capable of storing at least one of said audio segments;
- printing said images to obtain physical prints of said images; and
- supplying said physical prints together with said plurality of audio layers as electronic data related to said physical prints, wherein the audio layers are supplied on a medium separate from the physical prints.

24. An audio photograph data storage system comprising:
- means for storing a printed image on a first medium; and
- means for storing a plurality of audio segments associated with said printed image, said plurality of audio segments being arranged in a plurality of audio layers on a second medium different from the first medium.

25. An audio photograph data storage system comprising:
- a first, physical storage for storing a printed image therein; and
- a second, electronic storage for storing a plurality of audio segments associated with said printed image, said plurality of audio segments being arranged in a plurality of audio layers.

26. Apparatus for storing image data and audio data, comprising:
- a memory;
- a logic controller configured for:
  - storing image data representing a lurality of images in the memory; and
  - storing a plurality of audio layers in the memory such that a plurality of individual audio data segments relating to the data of one of said images can be stored in said audio layers,
  - wherein said image data and said audio data are arranged into sets of audio photographs each including the data of one of said images and a plurality of said audio layers, wherein audio photographs within said set are semantically related to each other.

27. A non-transitory computer readable medium storing a computer program having program instructions for causing a computer to store data representing an image;
- store a plurality of audio layers such that a plurality of individual audio data segments relating to said image data can be stored in said audio layers,
- arrange said image data and said audio data segments into sets of audio photographs each including said image data and a plurality of said audio layers, and
- enable a user to semantically relate the audio photographs within said set to each other.

* * * * *

UNITED STATES PATENT AND TRADEMARK OFFICE
CERTIFICATE OF CORRECTION

PATENT NO. : 8,059,921 B2
APPLICATION NO. : 10/426039
DATED : November 15, 2011
INVENTOR(S) : David Mark Frohlich et al.

It is certified that error appears in the above-identified patent and that said Letters Patent is hereby corrected as shown below:

In column 17, line 38, in Claim 11, delete "comprising" and insert -- comprising: --, therefor.

In column 20, line 22, in Claim 26, delete "lurality" and insert -- plurality --, therefor.

Signed and Sealed this
Eighteenth Day of September, 2012

David J. Kappos
*Director of the United States Patent and Trademark Office*